United States Patent
Kim et al.

(12)

(10) Patent No.: US 8,803,172 B2
(45) Date of Patent: Aug. 12, 2014

(54) TOP EMISSION INVERTED ORGANIC LIGHT EMITTING DIODE DISPLAY DEVICE HAVING ELECTRODE PATTERNS FORMED FROM A SAME MATERIAL AS A CONDUCTIVE PATTERN CONTACTING THE TFT

(75) Inventors: Yong Chul Kim, Gyeonggi-do (KR); Juhn Suk Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 233 days.

(21) Appl. No.: 12/639,414

(22) Filed: Dec. 16, 2009

(65) Prior Publication Data
US 2010/0213482 A1    Aug. 26, 2010

(30) Foreign Application Priority Data
Feb. 24, 2009    (KR) .................. 10-2009-0015460

(51) Int. Cl.
*H01L 27/32*    (2006.01)
*H01L 51/52*    (2006.01)

(52) U.S. Cl.
CPC ........ *H01L 27/3246* (2013.01); *H01L 27/3248* (2013.01); *H01L 27/3258* (2013.01); *H01L 27/3276* (2013.01); *H01L 51/5221* (2013.01); *H01L 2227/323* (2013.01); *H01L 2251/5315* (2013.01)
USPC .................................. 257/98; 257/72; 349/41

(58) Field of Classification Search
CPC ............ H01L 27/3246; H01L 27/3248; H01L 27/3258; H01L 27/3276; H01L 51/2221; H01L 2227/323; H01L 2251/5315
USPC ....................... 257/72, 98, E51.019
See application file for complete search history.

(56) References Cited

U.S. PATENT DOCUMENTS 6,620,655 B2 *   9/2003  Ha et al. .................. 438/149
6,888,597 B2 *   5/2005  Ha et al. .................. 349/114
(Continued)

FOREIGN PATENT DOCUMENTS

CN    1992264 A    7/2007
JP    2005-196172 A    7/2005
(Continued)

OTHER PUBLICATIONS

Chinese Office Action dated Mar. 30, 2011 for Chinese Application No. CN 200910226073.1.
(Continued)

*Primary Examiner* — Anh Mai
(74) *Attorney, Agent, or Firm* — Morgan, Lewis & Bockius LLP

(57) ABSTRACT

A top emission inverted OLED device is disclosed. The a top emission inverted OLED device includes: first and second pad portions disposed on peripheral areas which correspond to outer sides of a light generation area on a metal substrate; at least one thin film transistor formed on the light generation area; a passivation layer formed to cover the thin film transistor on the metal substrate and include contact holes which partially expose the thin film transistor and the first and second pad portions; a stacked pattern of first and second conductive patterns formed on the passivation layer and configured to make contact with the exposed part of the thin film transistor through one of the contact holes; a cathode electrode formed on the light generation area and electrically connected to the second conductive pattern; an organic light emission layer disposed on the cathode electrode; an anode electrode disposed on the organic light emission layer and formed from a transparent metal material; and electrode patterns formed from the same material as the second conductive pattern on the rest of the contact holes which expose the first and second pad portions.

8 Claims, 13 Drawing Sheets

(56) References Cited

U.S. PATENT DOCUMENTS

| | | |
|---|---|---|
| 7,022,557 B2 * | 4/2006 | Kim et al. .................... 438/149 |
| 7,109,655 B2 * | 9/2006 | Kurihara .................... 313/512 |
| 8,227,803 B2 * | 7/2012 | Park .................... 257/40 |
| 2005/0140877 A1 | 6/2005 | Jeoung et al. |
| 2007/0152222 A1 | 7/2007 | Joo .................... 257/72 |
| 2008/0231168 A1 | 9/2008 | Choi |
| 2009/0021454 A1 | 1/2009 | Satou et al. |

FOREIGN PATENT DOCUMENTS

| | | |
|---|---|---|
| JP | 2009-027037 A | 2/2009 |
| KR | 10-2008-0086201 A | 9/2008 |

OTHER PUBLICATIONS

KIPO—Office Action for Korean Patent Application No. 10-2009-0015460—Issued on Jan. 28, 2013.

* cited by examiner

TOP EMISSION INVERTED ORGANIC LIGHT EMITTING DIODE DISPLAY DEVICE HAVING ELECTRODE PATTERNS FORMED FROM A SAME MATERIAL AS A CONDUCTIVE PATTERN CONTACTING THE TFT

CROSS-REFERENCE TO RELATED APPLICATION

This application claims priority under 35 U.S.C. 119 to Korean Patent Application No 10-2009-0015460, filed on Feb. 24, 2009, which is hereby incorporated by reference in its entirety.

BACKGROUND

1. Field of the Disclosure

This disclosure relates to an organic light emitting diode display (OLED) device, and more particularly to an OLED device of the top-emission inverted type adapted to reduce the process of forming a thin film transistor on a metal substrate, and a manufacturing method thereof.

2. Description of the Related Art

OLED devices of a self luminous type can be light and slim since they do not need the backlight units required for liquid crystal display devices. Also, the OLED devices can be manufactured through a simple process. Moreover, the OLED devices have a low voltage drive, a high luminous efficiency, and a wide viewing angle. In view of these points, the OLED devices have received a growing amount of attention as one of next-generation display devices.

The OLED devices each include thin film transistors arranged on a substrate, organic light emitting diodes connected to the respective thin film transistors, and a seal substrate covering the organic light emitting diodes. The organic light emitting diodes are configured to emit light. Such OLED devices can be classified into a bottom emission type and a top emission type according to light emitting directions.

The top emission OLED device is configured to emit light through a seal substrate. As such, the top emission OLED device has a larger aperture ratio than that of the bottom emission OLED device. Moreover, the top emission OLED device can be designed in a variety of formations because the aperture ratio is not subject to a driving element.

However, the top emission OLED device employs a process of forming a thin film transistor using a maximum of 11 masks. In other words, the formation process of a thin film transistor is very complex. As such, the manufacturing efficiency of the top emission OLED device is deteriorated and manufacturing costs of the top emission OLED device increases.

Moreover, the top emission OLED device includes cathode electrodes formed by patterning a corrodible conductive material in pixels, and an organic light emission layer and anodes sequentially formed on the cathode electrodes. As such, the cathode electrodes are very easily corroded. Such corrosion of the cathode electrodes deteriorates the reliability of the top emission OLED device.

BRIEF SUMMARY

Accordingly, the present embodiments are directed to a top emission inverted OLED device that substantially obviates one or more of problems due to the limitations and disadvantages of the related art, and a manufacturing method thereof.

An object of the present embodiments is to provide a top emission inverted OLED device with enhanced reliability and a manufacturing method thereof.

Another object of the present embodiments is to provide a top emission OLED device that is adapted to simplify a manufacturing process, and a manufacturing method thereof.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a top emission inverted OLED device includes: first and second pad portions disposed on peripheral areas which correspond to outer sides of a light generation area on a metal substrate; at least one thin film transistor formed on the light generation area; a passivation layer formed to cover the thin film transistor on the metal substrate and include contact holes which partially expose the thin film transistor and the first and second pad portions; a stacked pattern of first and second conductive patterns formed on the passivation layer and configured to make contact with the exposed part of the thin film transistor through one of the contact holes; a cathode electrode formed on the light generation area and electrically connected to the second conductive pattern; an organic light emission layer disposed on the cathode electrode; an anode electrode disposed on the organic light emission layer and formed from a transparent metal material; and electrode patterns formed from the same material as the second conductive pattern on the rest of the contact holes which expose the first and second pad portions.

A top emission inverted OLED device according to another aspect of the present embodiment includes: first and second pad portions disposed on peripheral areas which correspond to outer sides of a light generation area on a metal substrate; at least one thin film transistor formed on the light generation area; a passivation layer formed to cover the thin film transistor on the metal substrate and include contact holes which partially expose the thin film transistor and the first and second pad portions; a conductive pattern formed on the passivation layer and configured to make contact with the exposed part of the thin film transistor through one of the contact holes; a first cathode electrode formed on the light generation area and electrically connected to the conductive pattern; a second cathode electrode formed on the first cathode electrode; an organic light emission layer disposed on the second cathode electrode; an anode electrode disposed on the organic light emission layer and formed from a transparent metal material; and electrode patterns formed from the same material as the conductive pattern on the rest of the contact holes which expose the first and second pad portions.

A method of manufacturing a top emission inverted OLED device, according to still another aspect of the present embodiment, includes: preparing a metal substrate defined into a light generation area and first and second pad areas positioned adjacent thereto; forming at least one thin film transistor on the light generation area; forming a passivation layer which is configured to cover the thin film transistor on the metal substrate and include contact holes partially exposing the thin film transistor and the first and second pad areas; forming first and second conductive patterns, which are configured to make contact with the exposed part of the thin film transistor through one of the contact holes, by sequentially depositing and patterning first and second conductive layers on the passivation layer; forming a planarization layer, which is configured to partially expose the thin film transistor and the first and second pad areas, on the metal substrate with the first and second conductive patterns; forming a cathode electrode, which is electrically connected to the second conductive pattern, on the metal substrate covered with the planarization layer; forming a bank pattern, which is configured to partially expose the cathode electrode and the first and second pad areas, on the metal substrate with the cathode electrode; forming an organic light emission layer on the exposed cathode electrode; and forming an anode electrode of a transparent conductive material on the organic light emission layer, wherein electrode patterns are formed, from the same material as the second conductive pattern, on the rest of the contact holes which expose the first and second pad areas.

A method of manufacturing a top emission inverted OLED device, according to further still another aspect of the present embodiment, includes: preparing a metal substrate defined into a light generation area and first and second pad areas positioned adjacent thereto; forming at least one thin film transistor on the light generation area; forming a passivation layer which is configured to cover the thin film transistor on the metal substrate and include contact holes partially exposing the thin film transistor and the first and second pad areas; forming a conductive pattern, which is configured to make contact with the exposed part of the thin film transistor through one of the contact holes, by depositing and patterning a conductive layer on the passivation layer; forming a planarization layer, which is configured to partially expose the thin film transistor and the first and second pad areas, on the metal substrate with the conductive pattern; forming first and second cathode electrodes, which is electrically connected to the conductive pattern, by sequentially stacking and patterning first and second metal layers on the metal substrate covered with the planarization layer; forming a bank pattern, which is configured to partially expose the second cathode electrode and the first and second pad areas, by providing and patterning a bank layer on the metal substrate with the first and second cathode electrodes; forming an organic light emission layer on the exposed second cathode electrode; and forming an anode electrode of a transparent metal material on the organic light emission layer, wherein electrode patterns are formed, from the same material as the conductive pattern, on the rest of the contact holes which expose the first and second pad areas.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
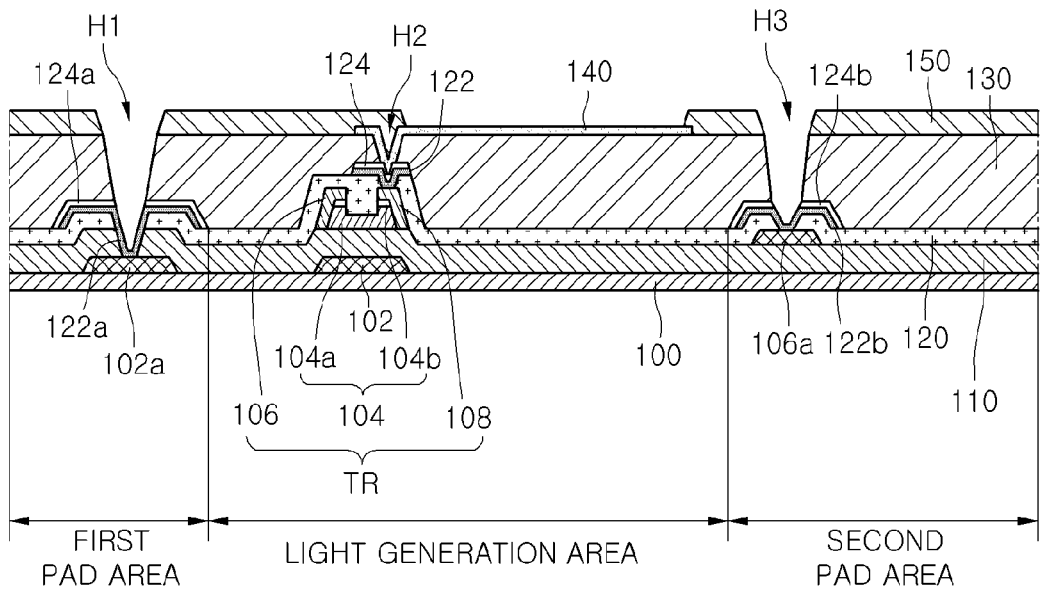
FIG. 1 is a cross-sectional view showing schematically a top emission inverted OLED device according to a first embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Referring to FIG. 1, the top emission inverted OLED device according to a first embodiment of the present disclosure includes a substrate 100 defined into a light generation area and peripheral areas thereof. The substrate 100 includes first and second pad portions each disposed on the peripheral areas. The substrate 100 is formed from a metal material. The first pad portion can include a gate pad portion, and the second pad portion can include a data pad portion.

At least one thin film transistor TR is formed on the light generation area of the substrate 100. The thin film transistor TR can be configured to include a gate electrode 102 covered with a gate insulation film 110, a semiconductor pattern 104 disposed opposite the gate electrode 102 in the center of the gate insulation film 110, and a source electrode 106 and a drain electrode 108 arranged separately in a fixed interval from each other on the semiconductor pattern 104. The semiconductor pattern 104 can include an active layer 104a formed from an amorphous silicon pattern, and ohmic contact layers 104b each formed from an impurity-doped amorphous silicon pattern. The ohmic contact layers 104b are interposed between the active layer 104a and the source electrode 106 as well as between the active layer 104a and the drain electrode 108, respectively.

The top emission inverted OLED device further can include a passivation (or a protective) layer 120 covering the thin film transistor TR on the substrate 100. The passivation layer 120 can be formed from an inorganic insulation material such as a silicon oxide material or a silicon nitride material. A first conductive pattern 122 and a second conductive pattern 124 are sequentially formed on the passivation layer 120 opposite to the thin film transistor 120. A second contact hole H2 is formed on the passivation layer 120 partially exposing the drain electrode 108. As such, the first conductive pattern 122 is electrically connected to the drain electrode 108 through the second contact hole H2.

The gate pad portion includes a lower gate pad electrode 102a formed from the same metal material as the gate electrode 102, and a stacked conductive pattern of first and second upper gate pad electrodes 122a and 124a formed on the passivation layer 120. The lower gate pad electrode 102a is covered with the gate insulation 110, and the passivation layer 120 is formed on the gate insulation film 110. As such, the lower gate pad electrode 102a is opposite the stacked conductive pattern of first and second upper gate pad electrodes 122a and 124a in the center of the gate insulation film 110 and the passivation layer 120. The lower gate pad electrode 102a is partially exposed by a second contact hole H2 penetrating through the passivation layer 120 and the gate insulation film 110. The first upper gate pad electrode 122a is electrically connected to the lower gate pad electrode 102a via the first contact hole H1.

The data pad portion includes a lower data pad electrode 106a formed from the same metal material as the source and drain electrodes 106 and 108 of the thin film transistor TR, and a stacked conductive pattern of first and second upper data pad electrodes 122b and 124b formed on the passivation layer 120 and opposite to the lower data pad electrode 102b. The lower data pad electrode 106a is disposed on the gate insulation film 110 coated on the substrate 100. Also, the lower data pad electrode is partially exposed by a third contact hole H3 penetrating through the passivation layer 120. The first upper data pad electrode 122b is electrically connected to the lower data pad electrode 106a via the third contact hole H3. The first upper data pad electrode 122b together with the first upper gate pad electrode 122a can be formed from the same material as the first conductive pattern 122. Similarly, the second upper data pad electrode 124b together with the second upper gate pad electrode 124a can be formed from the second conductive pattern 124.

The top emission inverted OLED device further includes a planarization layer 130 formed on the entire surface of the substrate 100 which is provided with the thin film transistor TR and the gate and data pad portions. The planarization layer 130 can be formed from an organic material such as polyimide, polyacryl or others. The planarization layer is flat and eliminates step coverages which are caused by the thin film transistor TR and the gate and data pad portions.

Moreover, the top emission inverted OLED device includes a cathode electrode 140 formed on the substrate covered with the planarization layer 130, and a bank pattern 150 on the substrate 100 provided with the cathode electrode 140. The cathode electrode 140 is electrically connected to the second conductive pattern 124 on the light generation area of the substrate 100 through the planarization layer 130. The bank pattern 150 is formed to partially expose the cathode electrode 140. Such a bank pattern 150 is formed to rim the cathode electrode 140, by depositing a sensitive insulation material such as polyimide or others and patterning the sensitive insulation material through a photography process. Normally, the bank pattern 150 is formed between the cathode electrodes 140 as the top emission inverted OLED device includes a plurality of light emitting diodes.

Figure 2A:
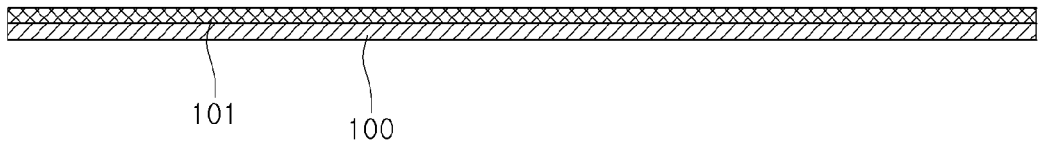
FIG. 2A to 2Q are cross-sectional views sequentially illustrating a process of manufacturing a top emission inverted OLED device of FIG. 1.
Figure 2B:
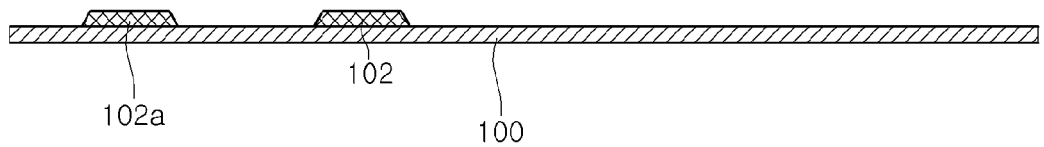
Figure 2C:
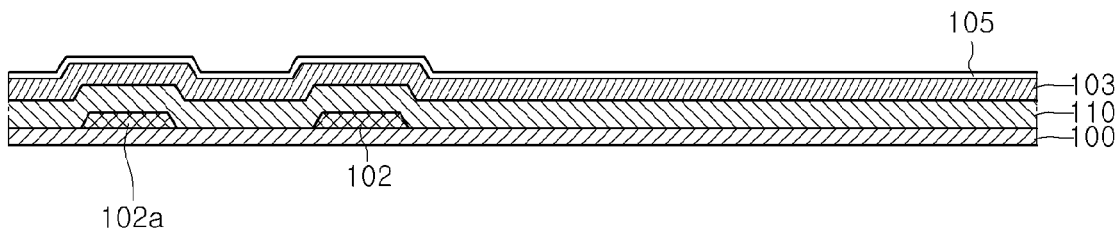
Figure 2D:
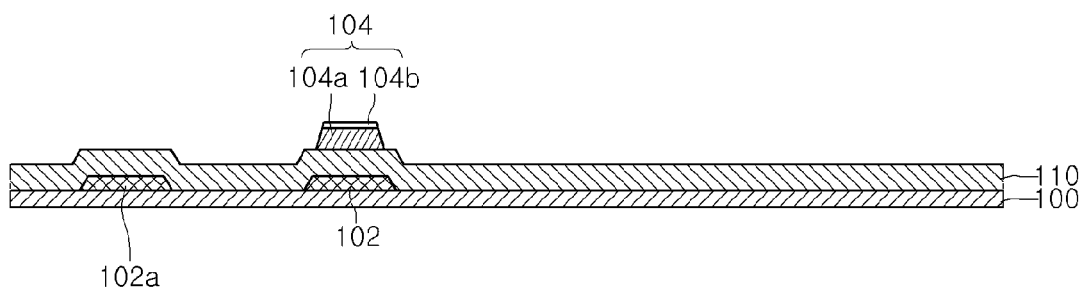
Figure 2E:
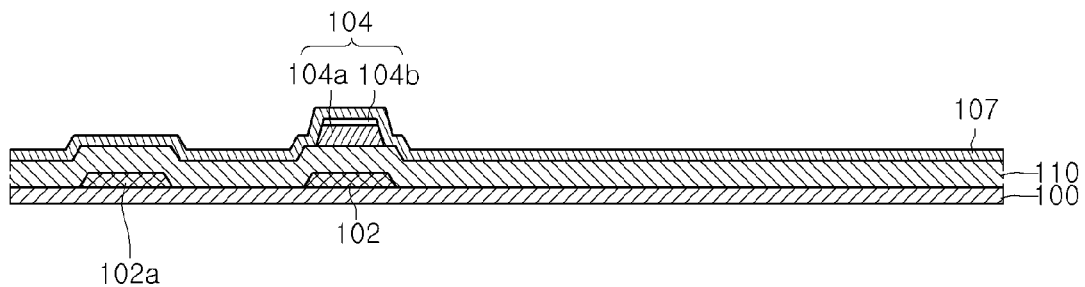
Figure 2F:
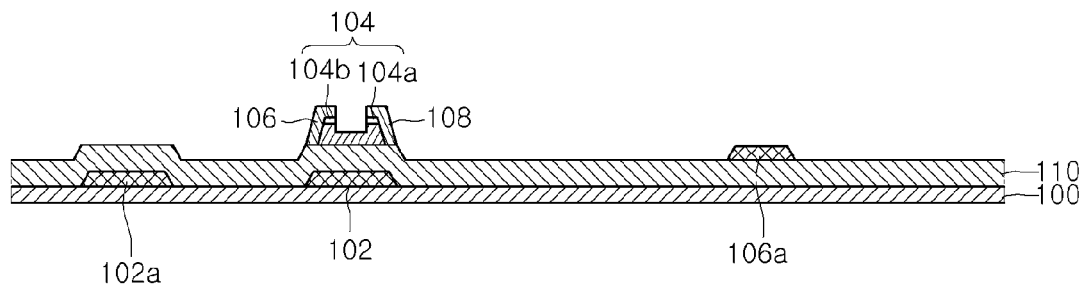
Figure 2G:
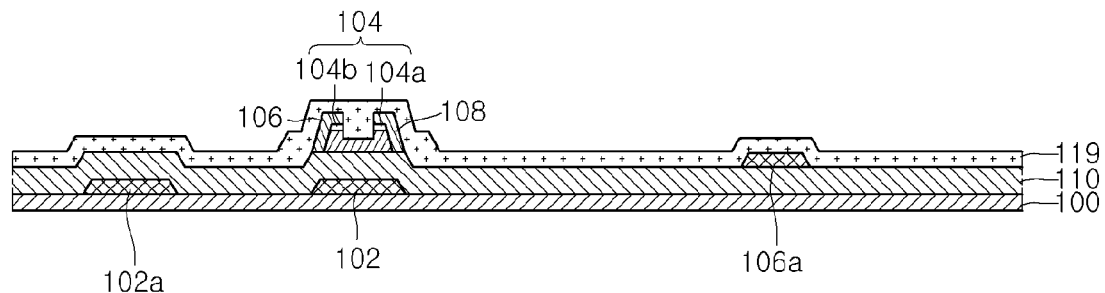
Figure 2H:
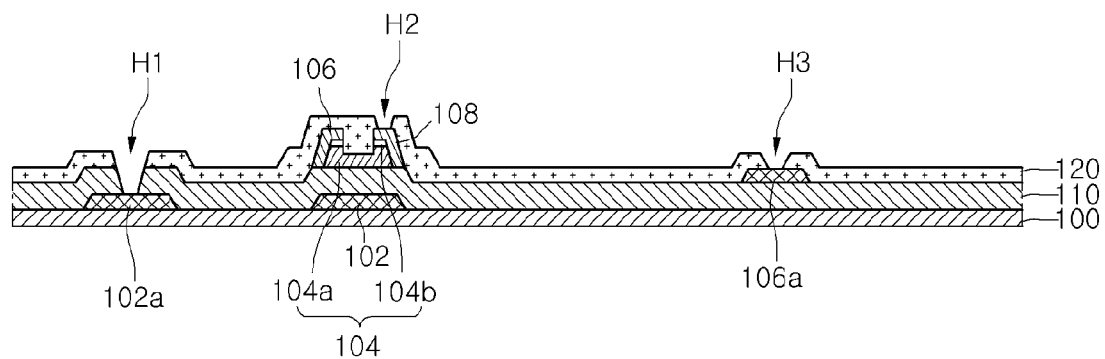
Figure 2I:
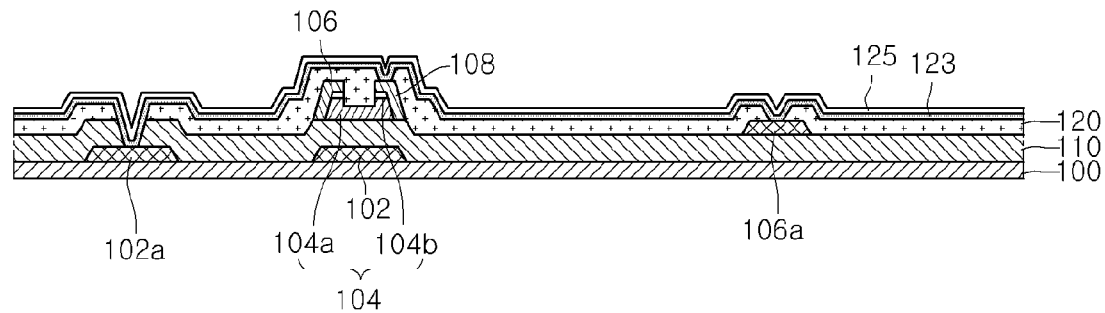
Figure 2J:
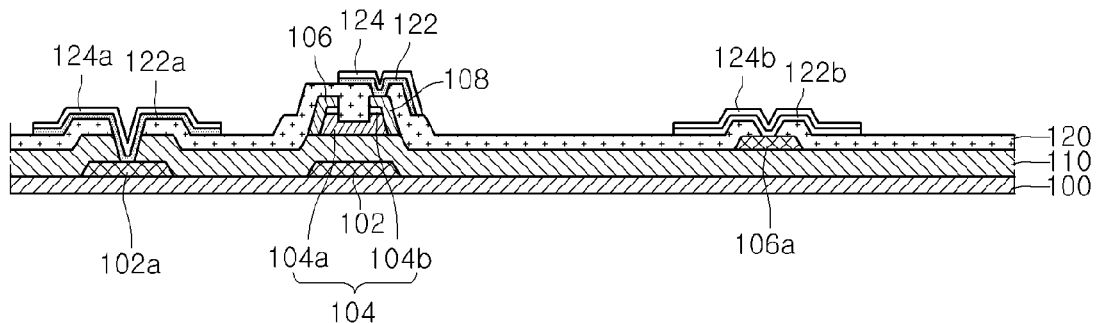
Figure 2K:
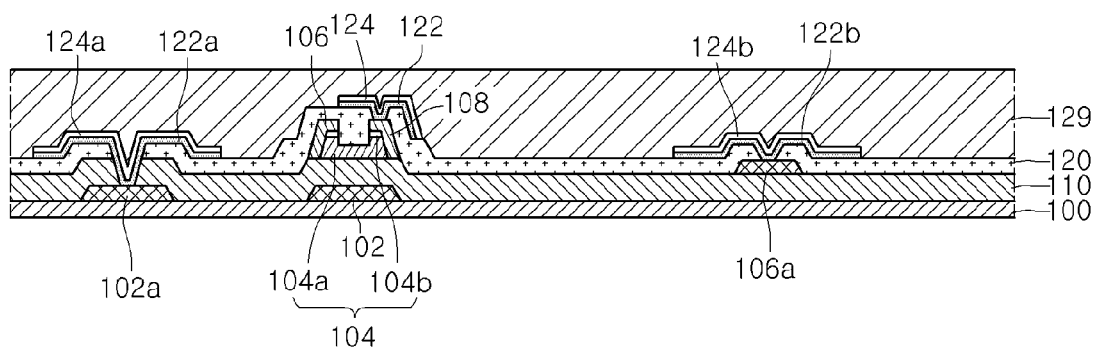
Figure 2L:
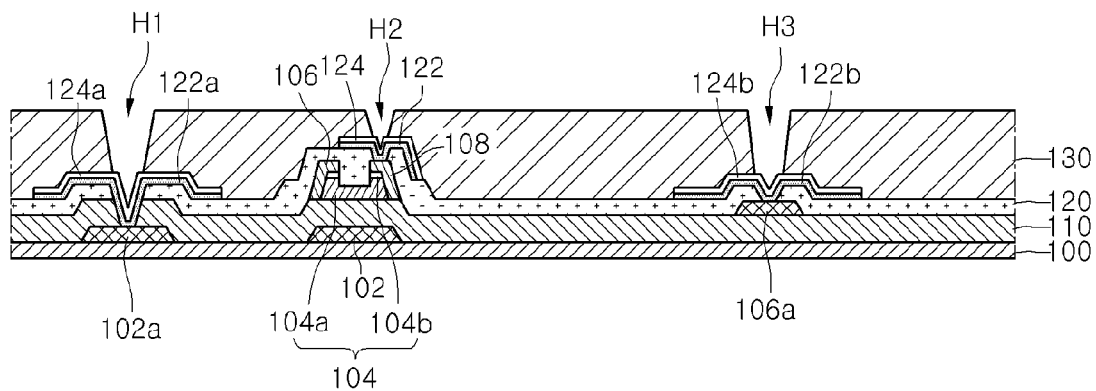
Figure 2M:
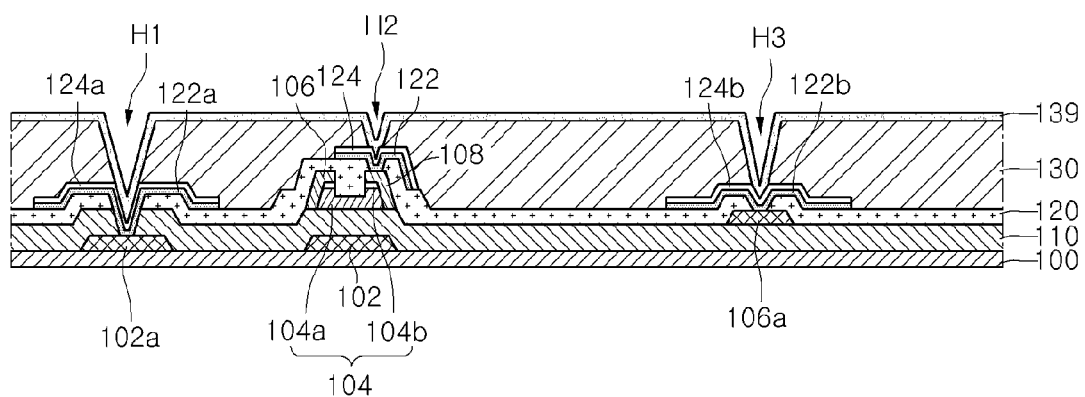
Figure 2N:
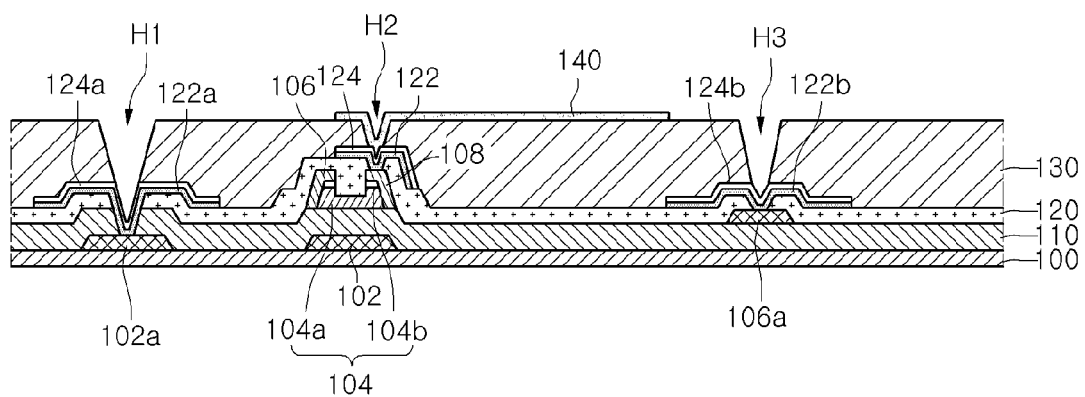
Figure 2O:
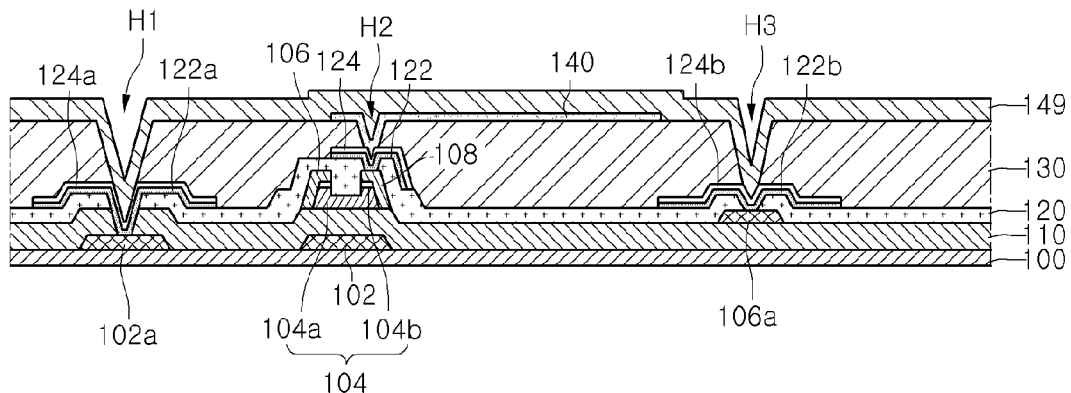
Figure 2P:
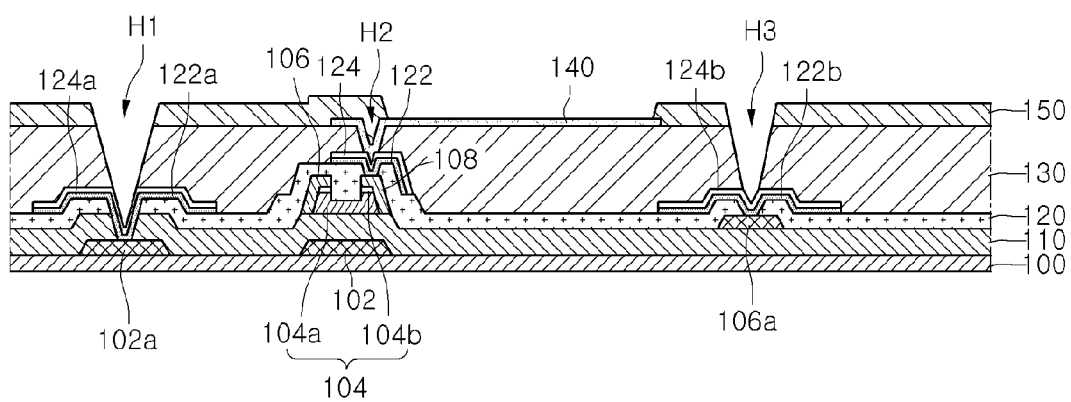
Figure 2Q:
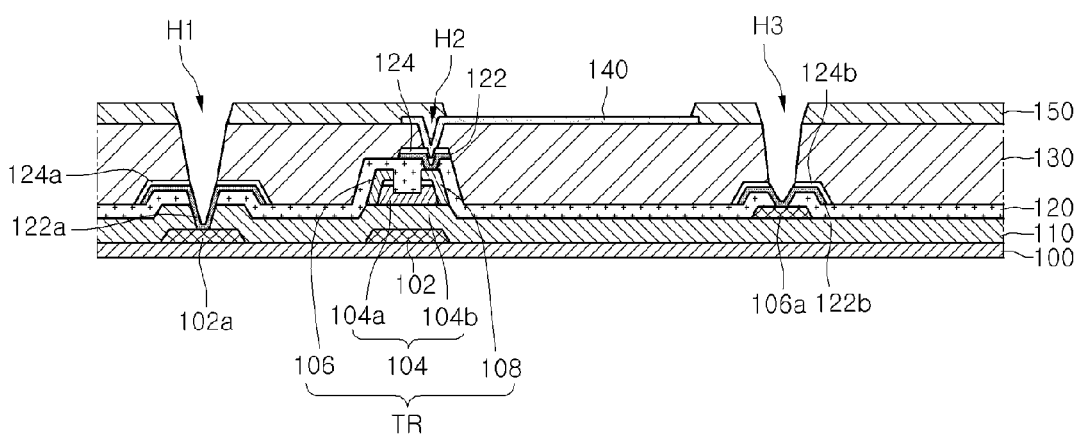

FIG. 2A to 2Q are cross-sectional views sequentially illustrating a process of manufacturing a top emission inverted OLED device of FIG. 1.

As shown in FIG. 2A, a first metal layer 101 is formed on a metal substrate 100. Although it is not shown in the drawings, an insulation film may be coated on the metal substrate 100 before the formation of the first metal layer 101. The first metal layer 101 is patterned by a photolithography process using a first mask (not shown), so that a gate electrode 102 and a lower gate pad electrode 102a are provided as shown in FIG. 2B. The gate electrode 102 is formed on a light generation area. The lower gate pad electrode 102a is formed on a gate pad area which corresponds to any one of the peripheral areas of the light generation area.

Then, a gate insulation film 110 is formed on the entire surface of the metal substrate 100 provided with the gate electrode 102 and the lower gate pad electrode 102a, as shown in FIG. 2C. Also, an amorphous silicon film 103 and an impurity-doped amorphous silicon film 105 are sequentially stacked on the entire surface of the metal substrate 100 covered with the gate insulation film 110. The sequentially stacked layers of the amorphous silicon film 103 and the impurity-doped amorphous silicon film 105 are patterned by a photolithography process using a second mask (not shown), and defined into an active layer pattern 104a and an ohmic contact layer pattern 104b which are stacked opposed the gate electrode 102, respectively, as shown in FIG. 2D. The active layer pattern 104a and the ohmic contact layer pattern 104b configure a semiconductor pattern 104.

As shown in FIG. 2E, a second metal layer 107 is formed on the entire surface of the metal substrate provided with the semiconductor pattern 104. The second metal layer 107 is patterned into a source electrode 106, a drain electrode 108, and a lower data pad electrode 106a by a photolithography process using a third mask (not shown), as shown in FIG. 2F. The source electrode 106 and the drain electrode 108 are separated at a fixed interval from each other, and the lower data pad electrode 106b is positioned at the data pad area which corresponds to another one of the peripheral areas of the light generation area. At the same time, the ohmic contact layer pattern 104 is partially removed to exposed the active layer pattern 104 between the source and drain electrodes 106 and 108.

Also, a passivation (or a protective) layer 119 is formed on the entire surface of the metal substrate 100 provided with the source electrode 106, the drain electrode 108, and the lower data pad electrode 106a, as shown in FIG. 2G. The passivation layer 119 is patterned through a photolithography process using a fourth mask (not shown), and defined into a passivation layer 120 with first to third contact holes H1~H3, as shown in FIG. 2H. The first contact hole H1 exposes a part of the lower gate electrode 102a by penetrating through the passivation layer 120 and the gate insulation film 110. The second contact hole H2 partially exposes the drain electrode 108. The third contact hole H3 exposes a part of the lower data pad electrode 106a. To this end, the first contact hole H1 is formed on the gate pad area, the second contact hole H2 is formed on the light generation area, and the third contact hole H3 is formed on the data pad area.

Subsequently, first and second conductive layers 123 and 125 are sequentially stacked on the entire surface of the metal substrate 100 covered with the passivation layer 120, as shown in FIG. 2I. The first conductive layer 123 can be formed to include indium-tin-oxide (ITO), and the second conductive layer 125 can be formed to include molybdenum (Mo). The second conductive layer 125 containing Mo is used in preventing a galvanic phenomenon generated between the first conductive layer 123 and a cathode electrode (140 in FIG. 1) which will be described below. The first and second conductive layers 123 and 125 are patterned by a photolithography process using a fifth mask (not shown), so as to be defined into a pair of stacked first and second conductive patterns 122 and 124, a pair of stacked first and second upper gate pad electrodes 122a and 124a, and a pair of stacked first and second upper data pad electrodes 122b and 124b, as shown in FIG. 2J.

More specifically, the first conductive layer 123 is patterned into the first conductive pattern 122, the first upper gate pad electrode 122a, and the first upper data pad electrode 122b. The second conductive layer 125 is patterned into the second conductive pattern 124, the second upper gate pad electrode 124a, and the second upper data pad electrode 124b. The stacked pattern of the first and second conductive patterns 122 and 124 are disposed on the passivation layer 120 and opposite to the drain electrode 108, and electrically connected to the drain electrode 108 via the second contact hole H2. The stacked pattern of the first and second upper gate pad electrodes 122a and 124a is disposed on the passivation layer 120 and opposite to the lower gate pad electrode 102a, and electrically connected to the lower gate pad electrode 102a via the first contact hole H1. The stacked pattern of the first and second upper data pad electrodes 122b and 124b is disposed on the passivation layer 120 and opposite to the lower data pad electrode 106a, and electrically connected to the lower data pad electrode 106a via the third contact hole H3.

As shown in FIG. 2K, a planarization layer 129 is formed on the entire surface of the metal substrate 100 which is provided with the first and second conductive patterns 122 and 124, the first and second upper gate pad electrodes 122a and 124b, and the first and second upper data pad electrodes 122b and 124b. The planarization layer 129 is patterned by a photolithography process using a sixth mask (not shown), thereby providing a defined planarization layer 130 with first to third contact holes H1~H3 as shown in FIG. 2L. The first to third contact holes H1~H3 partially expose the second upper gate pad electrode 124a, the second conductive pattern 124, and the second upper data pad electrode 124b, respectively.

Then, a third metal layer 139 is formed on the entire surface of the metal substrate 100 covered with the defined planarization layer 130, as shown in FIG. 2M. The third metal layer 130 is formed from an aluminum-neodymium alloy with superior reflectivity. The third metal layer 139 containing the aluminum-neodymium alloy is patterned into a cathode electrode 140 shown in FIG. 2N by a photolithography process using a seventh mask (not shown). The cathode electrode 140 is electrically connected to the second conductive pattern 124 via the second contact hole H2.

Also, a bank layer 149 is formed on the entire surface of the metal substrate partially covered with the cathode electrode 140, as shown in FIG. 2O. The bank layer 149 is patterned into a bank pattern 150, shown in FIG. 2P, by a photolithography process using an eight mask (not shown). The bank pattern 150 exposes the first and third contact holes H1 and H3 and a part of the cathode electrode 140. More specifically, the second upper gate pad electrode 124a and the second upper data pad electrode 124b are exposed by the first and third contact holes H1 and H3, respectively.

Subsequently, a dry etching process is performed on the metal substrate 100 provided with the bank pattern 150, thereby removing the second upper gate pad electrode 124a with the first contact hole H1 and the second upper data pad electrode 124b, as shown in FIG. 2Q. As such, the first upper gate pad electrode 122a formed from ITO is exposed through the first contact hole H1, and the first upper data pad electrode 122b formed from ITO is exposed through the third contact hole H3.

Moreover, an organic light emission layer and an anode electrode are sequentially stacked on the dry-etched metal substrate 100, even though they are not shown in the drawings. The anode electrode is formed from a transparent conductive metal.

The top emission inverted OLED device is manufactured using only 8 masks. As such, the manufacturing method of a top emission inverted OLED device according to the first embodiment can reduce the number of masks in comparison with that of the related art. In other words, the manufacturing method of a top emission inverted OLED device according the second embodiment can reduce from a maximum of 11 masking processes in that of the related art into 8 masking processes. Therefore, the manufacturing process of the top emission inverted OLED device can be simplified, and manufacturing costs of the top emission inverted OLED device can be cut down.

Figure 3:
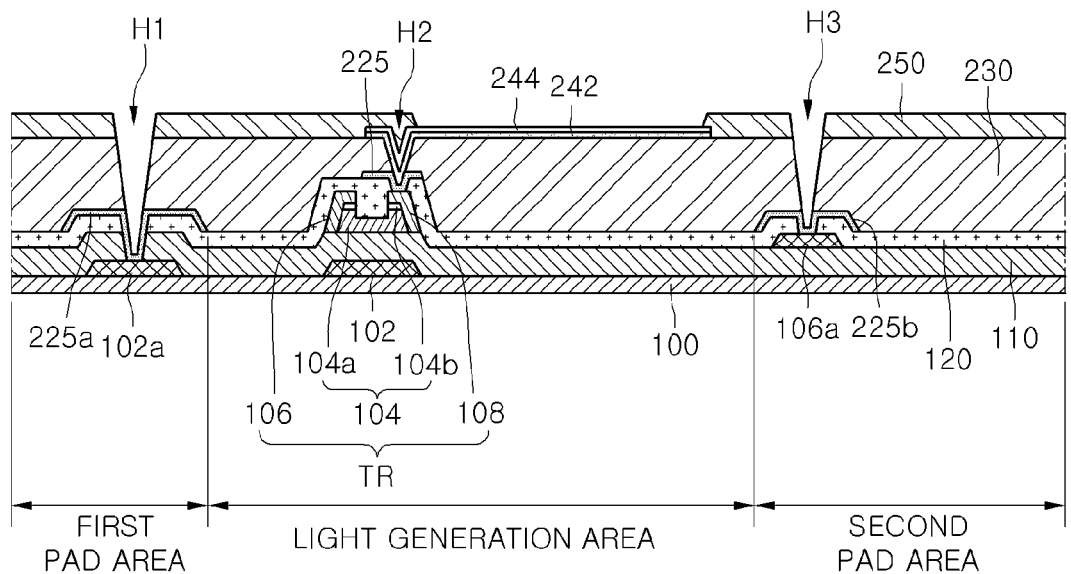
FIG. 3 is a cross-sectional view showing schematically a top emission inverted OLED device according to a second embodiment of the present disclosure.

FIG. 3 is a cross-sectional view showing schematically a top emission inverted OLED device according to a second embodiment of the present disclosure. The top emission inverted OLED device of the second embodiment has the same configuration as the one of the first embodiment described above, except that it includes stacked pattern of first and second cathodes 242 and 244 instead of the cathode electrode 140, the second conductive pattern 124, the second upper gate pad electrode 124a, and the second upper data pad electrode 124b. Accordingly, the description of the first embodiment to be repeated in the second embodiment of the present disclosure will be omitted. Also, the top emission inverted OLED device according to the second embodiment of the present disclosure will refer to the same reference terms and numbers for the same configuration as that according to the first embodiment.

As shown in FIG. 3, the top emission inverted OLED device according to a first embodiment of the present disclosure includes a metal substrate 100 defined into a light generation area and peripheral areas thereof. The substrate 100 includes gate and data pad portions each disposed on the peripheral areas.

At least one thin film transistor TR is formed on the light generation area of the substrate 100. The thin film transistor TR includes a gate electrode 102 covered with a gate insulation film 110, a semiconductor pattern 104 disposed opposite the gate electrode 102 in the center of the gate insulation film 110, and a source electrode 106 and a drain electrode 108 arranged separately in a fixed interval from each other on the semiconductor pattern 104.

The top emission inverted OLED device further include a conductive pattern 225 formed on a passivation (or a protective) layer 120 which covers the thin film transistor TR on the light generation area. The conductive pattern 225 is electrically connected to the drain electrode 108 of the thin film transistor TR.

The gate pad portion includes a lower gate pad electrode 102a formed from the same metal material as the gate electrode 102, and an upper gate pad electrode 225a formed on the passivation layer 120. The lower gate pad electrode 102a is covered with the gate insulation 110, the passivation layer 120 is formed on the gate insulation film 110. The upper gate pad electrode 225a is electrically connected to the lower gate pad electrode 102a.

The data pad portion includes a lower data pad electrode 106a formed from the same material as the source electrode 106 of the thin film transistor TR, and an upper data pad electrode 225b formed on the passivation layer 120. The lower data pad electrode 225b is covered with the passivation layer 120. The upper data pad electrode 225b is electrically connected to the lower data pad electrode 106a.

The top emission inverted OLED device further includes a planarization layer 230 formed on the entire surface of the substrate 100 which is provided with the conductive pattern 225, the upper gate pad electrode 225a, and the upper data pad electrode 225b. Also, first and second cathode electrodes 242 and 244 are formed on the planarization layer 230 corresponding to the light generation area. The first and second cathode electrodes 242 and 244 are electrically connected to the conductive pattern 225. Furthermore, a bank layer 250 on the substrate 100 is provided with the first and second cathode electrodes 242 and 244. The bank layer 250 is partially formed to expose the second cathode electrode 244, by a pattern process.

Figure 4A:
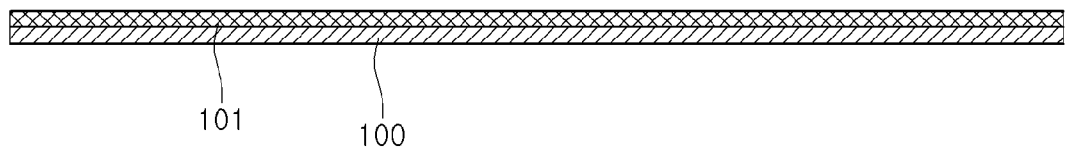
FIG. 4A to 4P are cross-sectional views sequentially illustrating a process of manufacturing a top emission inverted OLED device of FIG. 3.
Figure 4B:
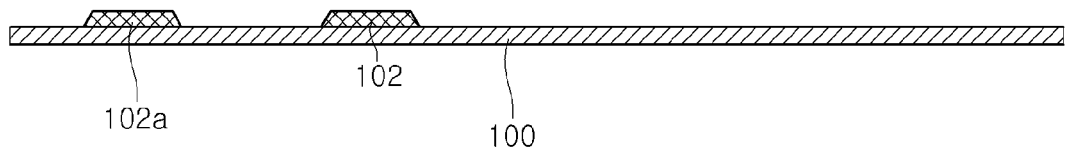
Figure 4C:
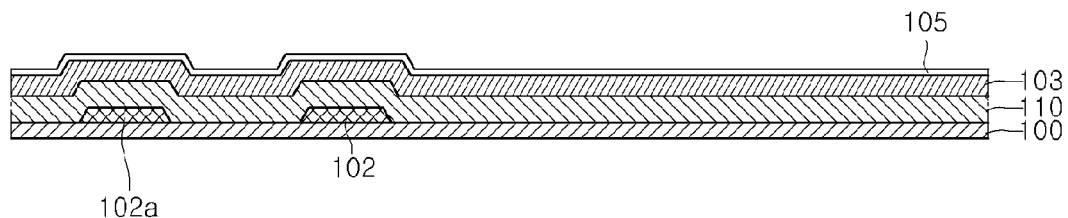
Figure 4D:
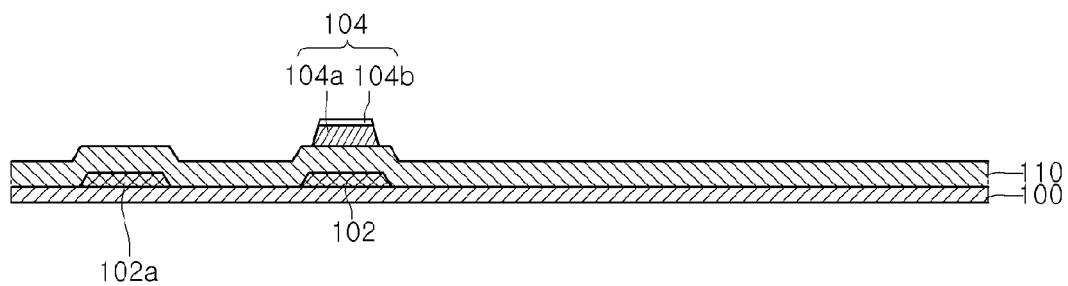
Figure 4E:
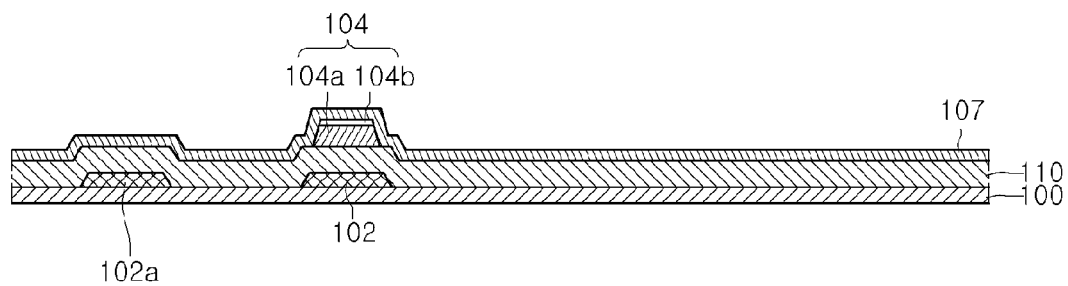
Figure 4F:
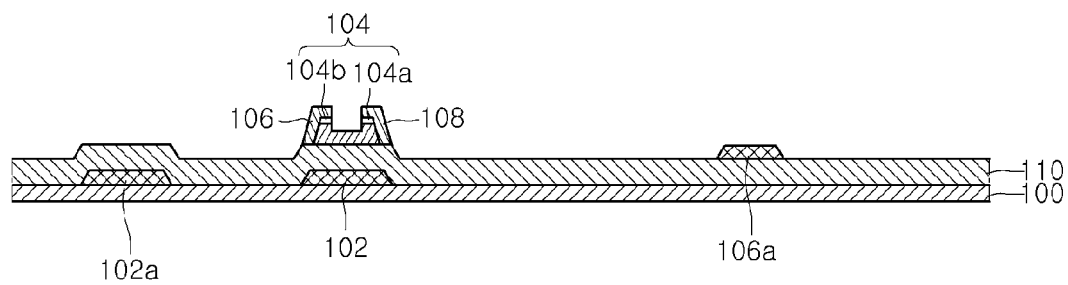
Figure 4G:
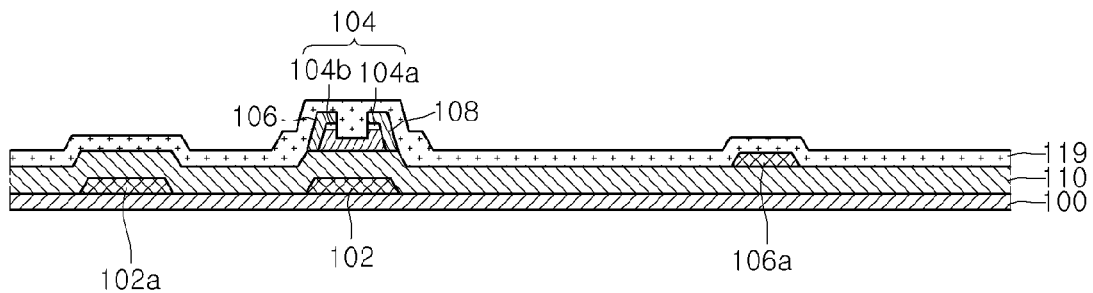
Figure 4H:
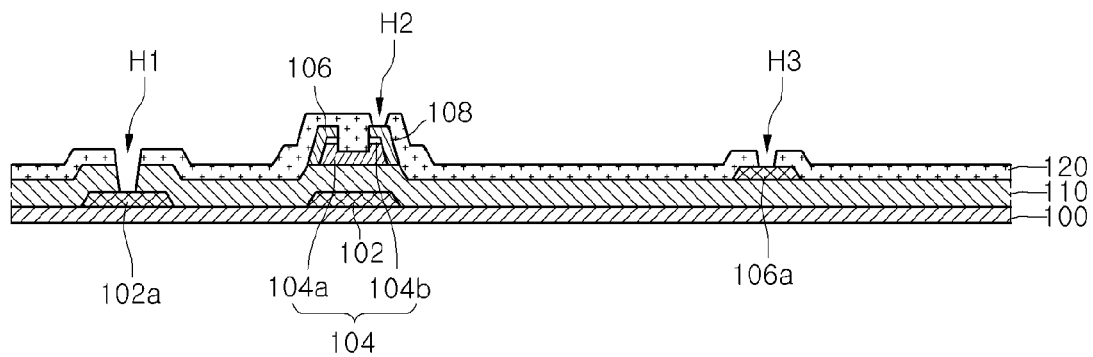
Figure 4I:
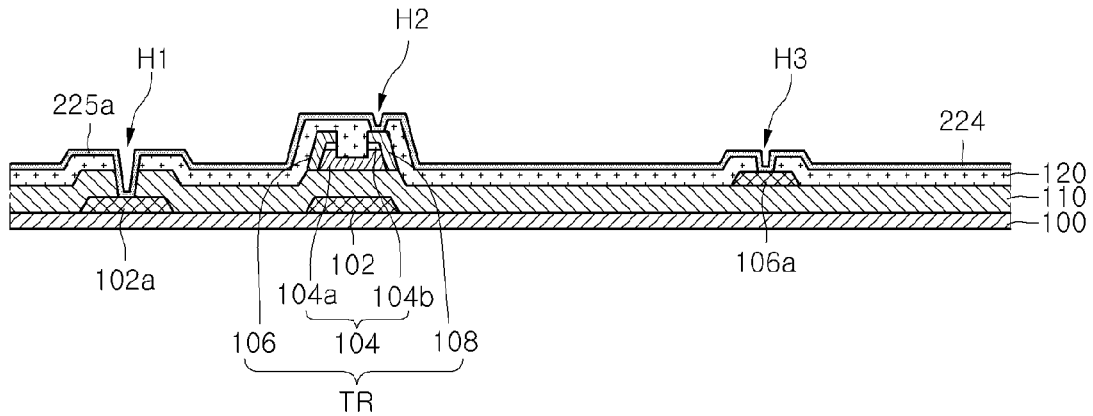
Figure 4J:
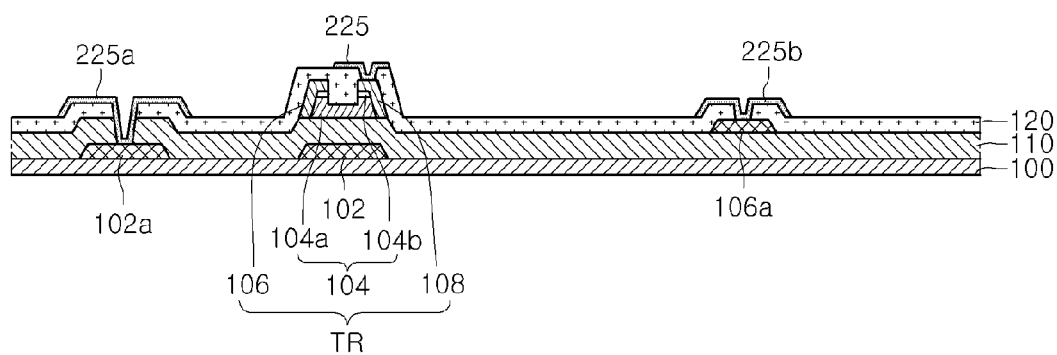
Figure 4K:
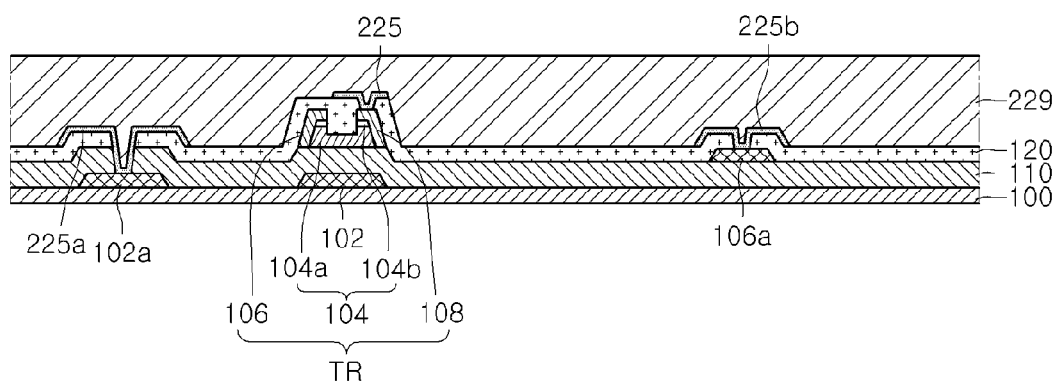
Figure 4L:
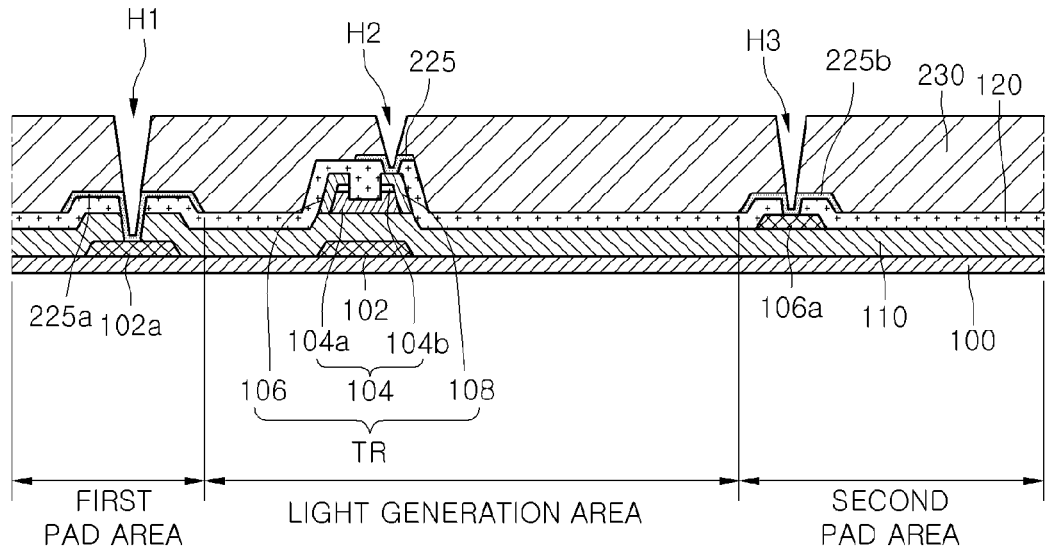
Figure 4L:
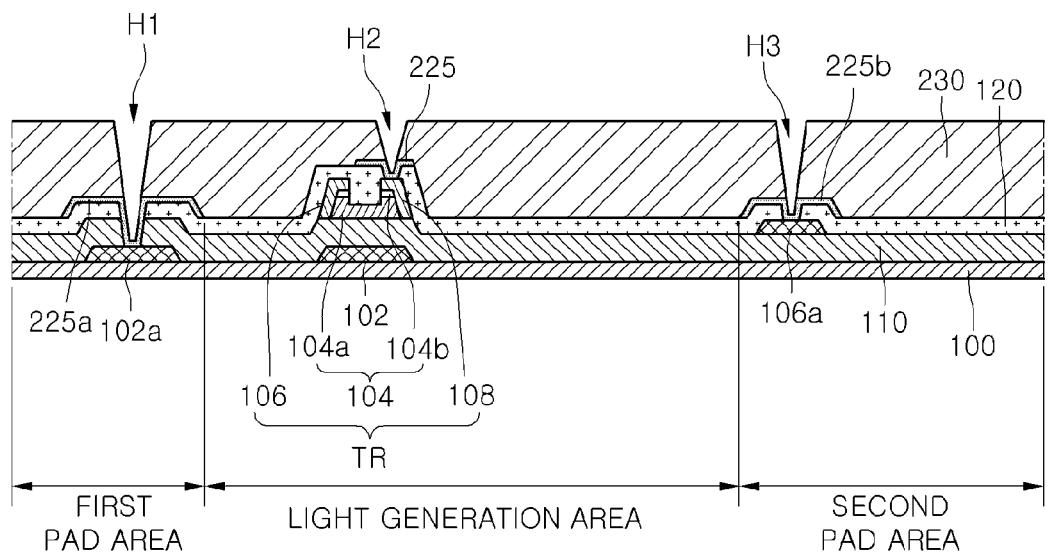
Figure 4M:
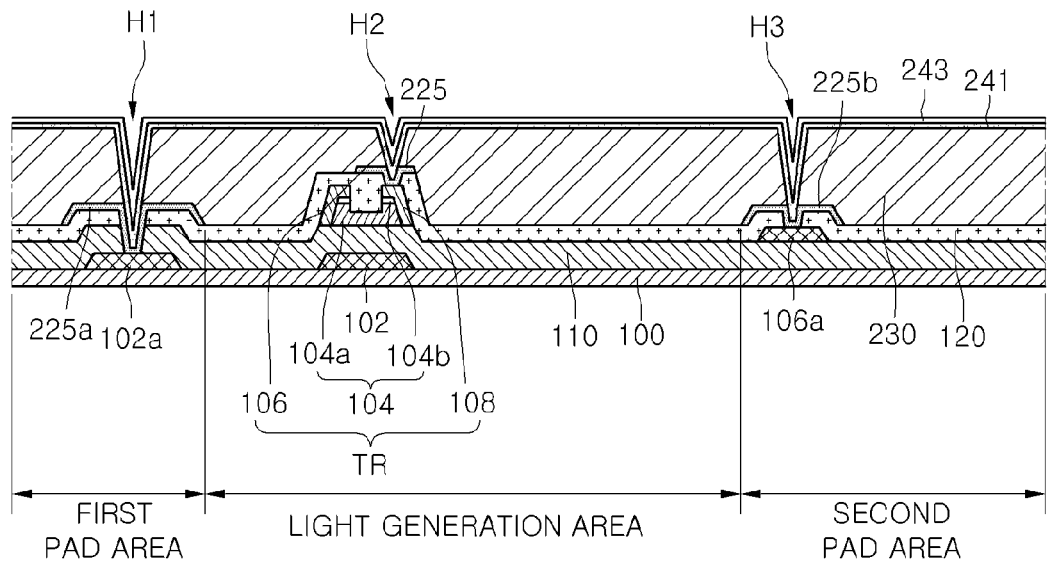
Figure 4N:
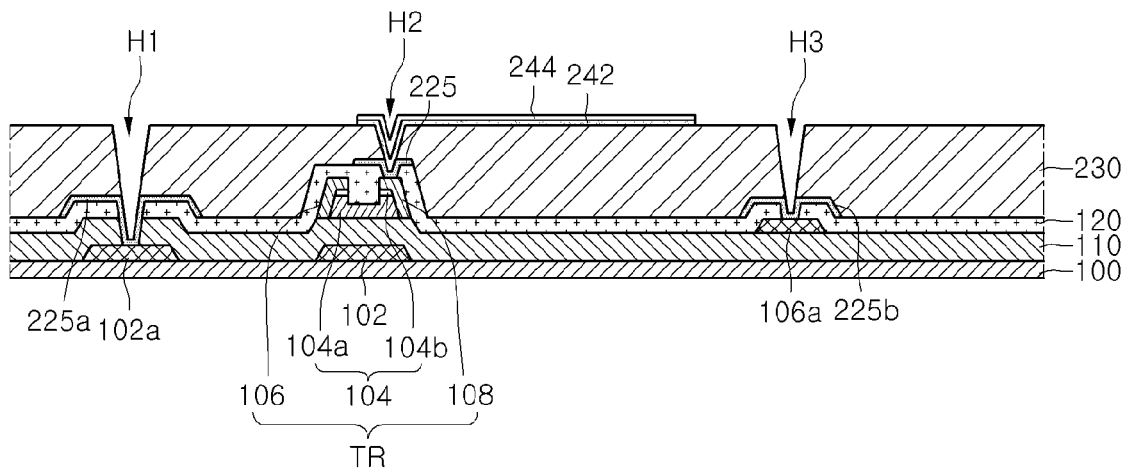
Figure 4O:
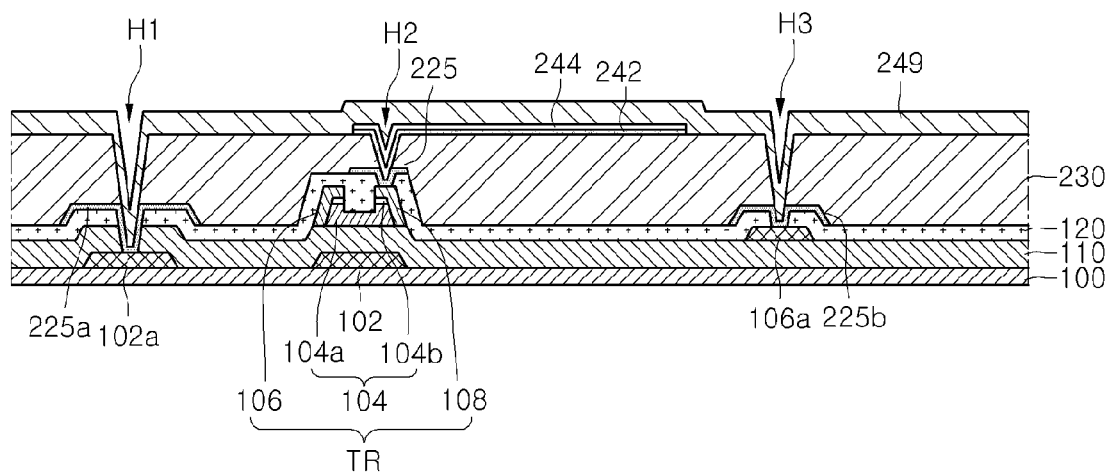
Figure 4P:
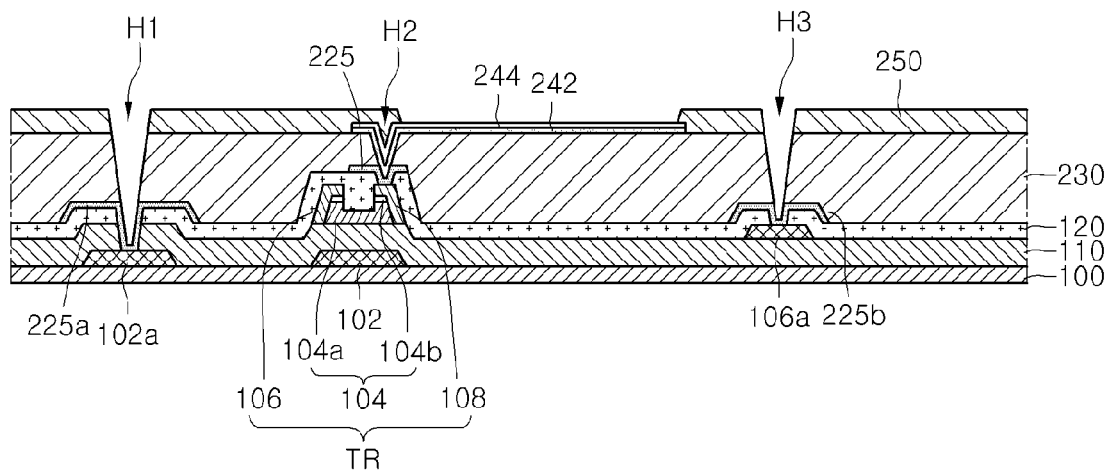

FIG. 4A to 4P are cross-sectional views sequentially illustrating a process of manufacturing a top emission inverted OLED device of FIG. 3.

The processes of FIGS. 4A to 4H in the manufacturing method of the second embodiment are the same as those of FIGS. 2A to 2h in that of the first embodiment described above. Accordingly, the description of the first embodiment to be repeated in the second embodiment of the present disclosure will be omitted.

As shown in FIG. 4I, a conductive layer 224 is stacked on the entire surface of the metal substrate 100 covered with the passivation layer 120. The conductive layer 224 is formed from indium-tin-oxide (ITO). The conductive layer 224 is patterned by a photolithography process using a fifth mask (not shown), so as to be defined into a conductive pattern 225, an upper gate pad electrode 225a, and an upper data pad electrode 225b, as shown in FIG. 4J.

Also, a planarization layer 229 is formed on the entire surface of the metal substrate 100 provided with the conductive pattern 225, the upper gate pad electrode 225a, and the upper data pad electrode 225b, as shown in FIG. 4K. The planarization layer 229 is patterned by a photolithography process using a sixth mask (not shown), thereby providing a defined planarization layer 230 with first to third contact holes H1~H3 as shown in FIG. 4L. The first to third contact holes H1~H3 partially expose the upper gate pad electrode 225a, the conductive pattern 225, and the upper data pad electrode 225b, respectively.

Then, third and metal layers 241 and 243 are sequentially formed on the entire surface of the metal substrate 100 covered with the defined planarization layer 230, as shown in FIG. 4M. The third metal layer 241 is formed from molybdenum (Mo), and the fourth metal layer 243 is formed from an aluminum-neodymium alloy with superior reflectivity. The third and metal layers 241 and 243 are patterned through a photolithography process using a seventh mask (not shown), and defined into a first cathode electrode 242 and a second cathode electrode 244 which are disposed in a stacked shape on the light generation area, shown in FIG. 4N. The first cathode electrode 242 is electrically connected to the conductive pattern 225 via the second contact hole H2. The first cathode electrode 242 is formed from molybdenum (Mo) between the planarization layer 230 and the second cathode electrode 244 prevents a problem of adhesive strength caused by a cathode electrode of AlNd which is formed directly on the planarization layer 230. In other words, the top emission inverted OLED device of the second embodiment forces a cathode electrode to form a double metal layer of Mo and AlNd.

Subsequently, a bank layer 249 is formed on the entire surface of the metal substrate 100 partially covered with the stacked first and second cathode electrodes 242 and 242, as shown in FIG. 4O. The bank layer 249 is patterned into a bank pattern 250, shown in FIG. 4P, by a photolithography process using an eight mask (not shown). The bank pattern 250 exposes the first and third contact holes H1 and H3 and a part of the second cathode electrode 244. As such, the upper gate pad electrode 225a and the upper data pad electrode 225b are exposed by the first and third contact holes H1 and H3, respectively.

Furthermore, an organic light emission layer and an anode electrode are sequentially stacked on the above structured metal substrate 100, even though they are not shown in the drawings. The anode electrode is formed from a transparent conductive metal.

As described above, the top emission inverted OLED device is manufactured using only 8 masks. As such, the manufacturing method of a top emission inverted OLED device according the second embodiment can reduce the number of masks in comparison with that of the related art. In other words, the manufacturing method of a top emission inverted OLED device according the second embodiment can reduce from a maximum of 11 masking processes in that of the related art into 8 masking processes. Therefore, the manufacturing process of the top emission inverted OLED device can be simplified, and manufacturing costs of the top emission inverted OLED device can be cut down.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A top-emission inverted organic light emitting diode display device, comprising:
   first and second pad portions disposed on peripheral areas which correspond to outer sides of a light generation area on a metal substrate;
   at least one thin film transistor formed on the light generation area;
   a passivation layer formed to cover the thin film transistor on the metal substrate and include primary contact holes which partially expose the thin film transistor and the first and second pad portions;
   a stacked pattern of first and second conductive patterns formed on the passivation layer and configured to make contact with the exposed part of the thin film transistor through one of the primary contact holes;
   a planarization layer formed on the passivation layer including the first and second conductive patterns; and
   a cathode electrode formed on the light generation area and electrically connected to the second conductive pattern,
   wherein the planarization layer includes secondary contact holes corresponding to the primary contact holes,
   wherein each of the first and second pad portions includes a first upper pad electrode formed from the same material as the first conductive pattern and a second upper pad electrode formed from the same material as the second conductive pattern on the first upper pad electrode,
   wherein the first upper pad electrodes are exposed through the secondary contact holes, and
   wherein the cathode electrode is formed on the planarization layer.

2. The top-emission inverted organic light emitting diode display device of claim 1, wherein the first conductive pattern is formed from indium-tin-oxide and the second conductive pattern is formed from molybdenum.

3. The top-emission inverted organic light emitting diode display device of claim 1, wherein the cathode electrode is formed from an aluminum-neodymium alloy.

4. The top-emission inverted organic light emitting diode display device of claim 1, wherein edge surfaces of the first upper pad electrode are vertically same as edge surfaces of second upper pad electrode.

5. A top-emission inverted organic light emitting diode display device, comprising:
- first and second pad portions disposed on peripheral areas which correspond to outer sides of a light generation area on a metal substrate;
- at least one thin film transistor formed on the light generation area;
- a passivation layer formed to cover the thin film transistor on the metal substrate and including primary contact holes which partially expose the thin film transistor and the first and second pad portions;
- a conductive pattern formed on the passivation layer and configured to make contact with the exposed part of the thin film transistor through one of the primary contact holes;
- a planarization layer formed on the passivation layer including the conductive pattern;
- a first cathode electrode formed on the light generation area and electrically connected to the conductive pattern;
- a second cathode electrode formed on the first cathode electrode; and
- a bank layer formed on the planarization layer and formed to expose the second cathode electrode,
- wherein the planarization layer includes secondary contact holes corresponding to the primary contact holes,
- wherein each of the first and second pad portions includes an upper pad electrode formed from the same material as the conductive pattern,
- wherein the upper pad electrodes are exposed through the secondary contact holes,
- wherein the bank layer is formed to expose the upper pad electrode, and
- wherein the conductive pattern is only formed at an area corresponding to the thin film transistor.

6. The top-emission inverted organic light emitting diode display device of claim 5, wherein the first cathode electrode is formed from molybdenum and the second cathode electrode is formed from an aluminum-neodymium alloy.

7. The top-emission inverted organic light emitting diode display device of claim 5, wherein the conductive pattern is formed from indium-tin-oxide.

8. The top-emission inverted organic light emitting diode display device of claim 5, wherein edge surfaces of the first cathode electrode are vertically same as edge surfaces of the second cathode electrode.

* * * * *